(12) United States Patent
Girardeau, Jr.

(10) Patent No.: US 7,714,754 B2
(45) Date of Patent: May 11, 2010

(54) ENTROPY DECODER WITH PIPELINED PROCESSING AND METHODS FOR USE THEREWITH

(75) Inventor: James Ward Girardeau, Jr., Austin, TX (US)

(73) Assignee: VIXS Systems, Inc., Toronto, Ontario (CA)

( * ) Notice: Subject to any disclaimer, the term of this patent is extended or adjusted under 35 U.S.C. 154(b) by 25 days.

(21) Appl. No.: 12/172,529

(22) Filed: Jul. 14, 2008

(65) Prior Publication Data

US 2010/0007534 A1 Jan. 14, 2010

(51) Int. Cl.
*H03M 7/00* (2006.01)

(52) U.S. Cl. .............................. 341/107; 341/50; 341/51

(58) Field of Classification Search .................... 341/50, 341/51, 107
See application file for complete search history.

(56) References Cited

U.S. PATENT DOCUMENTS

| | | | |
|---|---|---|---|
| 7,321,323 B2 * | 1/2008 | Sekiguchi et al. ............ | 341/107 |
| 7,443,318 B2 * | 10/2008 | Hung et al. .................... | 341/51 |
| 2005/0146451 A1 * | 7/2005 | Kobayashi et al. .......... | 341/107 |
| 2006/0126744 A1 * | 6/2006 | Peng et al. .............. | 375/240.26 |
| 2006/0158355 A1 * | 7/2006 | Jeon et al. ...................... | 341/50 |
| 2006/0232454 A1 * | 10/2006 | Cha et al. ...................... | 341/51 |
| 2007/0040708 A1 * | 2/2007 | Senda .......................... | 341/50 |

\* cited by examiner

*Primary Examiner*—Jean B Jeanglaude
(74) *Attorney, Agent, or Firm*—Garlick Harrison & Markison; Bruce E. Stuckman

(57) ABSTRACT

An entropy decoding module includes a binary arithmetic coding module that generates a bin string by pipeline processing a bit stream, based on a clock signal and based on context model information. A binarization and context modeling module generates a stream of syntax elements and the context model information based on the bin string.

27 Claims, 12 Drawing Sheets

Video encoding operation

Video decoding operation

ENTROPY DECODER WITH PIPELINED PROCESSING AND METHODS FOR USE THEREWITH

TECHNICAL FIELD OF THE INVENTION

The present invention relates to entropy decoding used in devices such as video decoders/codecs.

DESCRIPTION OF RELATED ART

Video encoding has become an important issue for modern video processing devices. Robust encoding algorithms allow video signals to be transmitted with reduced bandwidth and stored in less memory. However, the accuracy of these encoding methods face the scrutiny of users that are becoming accustomed to greater resolution and higher picture quality. Standards have been promulgated for many encoding methods including the H.264 standard that is also referred to as MPEG-4, part 10 or Advanced Video Coding, (AVC).

Context adaptive binary arithmetic coding (CABAC) is a type of coding included in H.264. While CABAC is only a small part of H.264 decoding, CABAC processing can be on the critical path for the overall decoding. In particular, the difficulty with the CABAC decoder is that it is recursive, and difficult to implement in parallel. Faster CABAC processing can, in many circumstances, lead to faster video decoding.

Further limitations and disadvantages of conventional and traditional approaches will become apparent to one of ordinary skill in the art through comparison of such systems with the present invention.

DETAILED DESCRIPTION OF THE INVENTION INCLUDING THE PRESENTLY PREFERRED EMBODIMENTS

Figure 1:
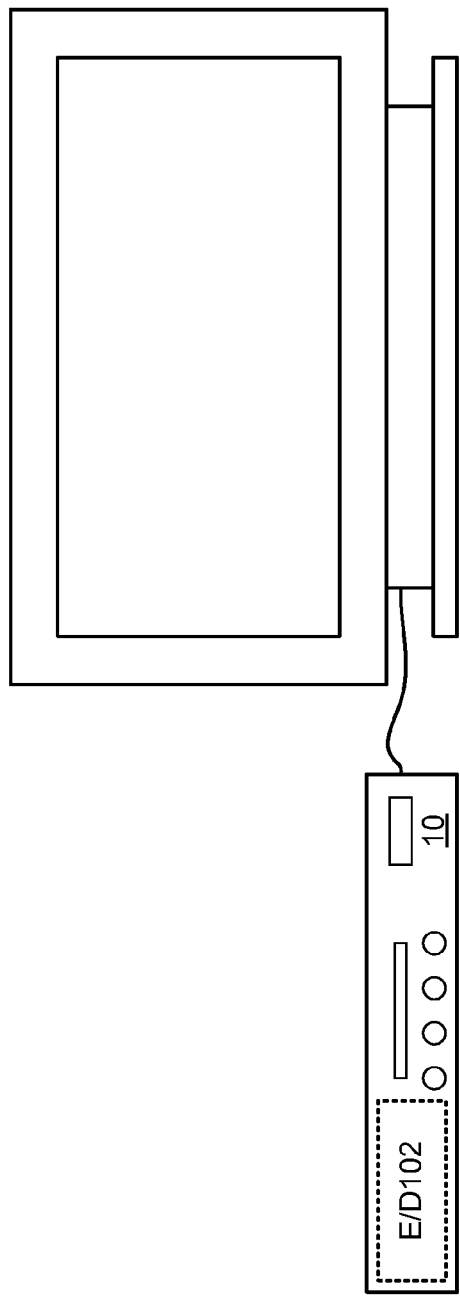
FIGS. 1-3 present pictorial diagram representations of various devices in accordance with embodiments of the present invention.
Figure 3:
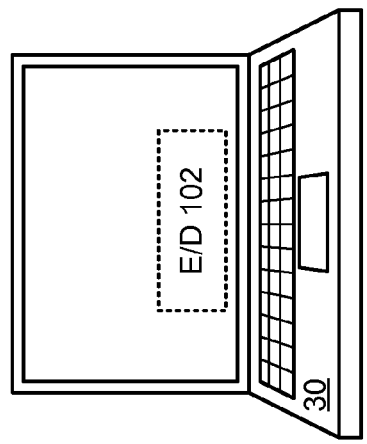
Figure 2:
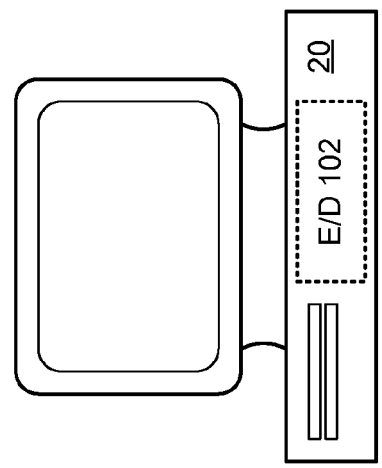

FIGS. 1-3 present pictorial diagram representations of a various video processing devices in accordance with embodiments of the present invention. In particular, set top box 10 with built-in digital video recorder functionality or a stand alone digital video recorder, computer 20 and portable computer 30 illustrate electronic devices that incorporate a video processing device 125 that includes one or more features or functions of the present invention. While these particular devices are illustrated, video processing device 125 includes any device that is capable of decoding video content in accordance with the methods and systems described in conjunction with FIGS. 4-15 and the appended claims.

Figure 4:
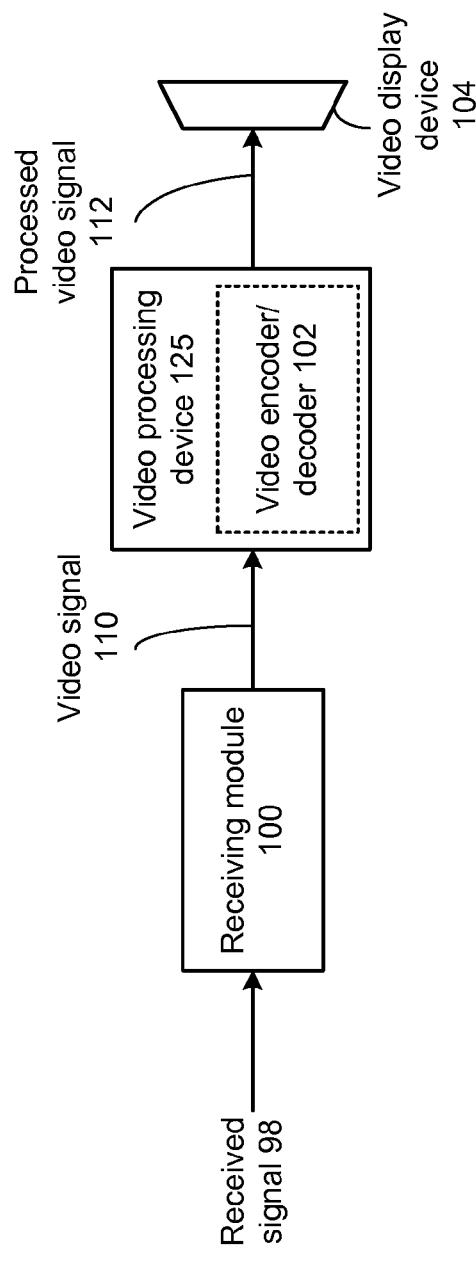
FIG. 4 presents a block diagram representation of a video processing device in accordance with an embodiment of the present invention.

FIG. 4 presents a block diagram representation of a video processing device 125 in accordance with an embodiment of the present invention. In particular, video processing device 125 includes a receiving module 100, such as a television receiver, cable television receiver, satellite broadcast receiver, broadband modem, 3G transceiver or other information receiver or transceiver that is capable of receiving a received signal 98 and extracting one or more video signals 110 via time division demultiplexing, frequency division demultiplexing or other demultiplexing technique. Video encoder/decoder module 102 is coupled to the receiving module 100 to encode, decoder and/or transcode the video signal 110 in a format corresponding to video display device 104.

In an embodiment of the present invention, the received signal 98 is a broadcast video signal, such as a television signal, high definition television signal, enhanced high definition television signal or other broadcast video signal that has been transmitted over a wireless medium, either directly or through one or more satellites or other relay stations or through a cable network, optical network or other transmission network. In addition, received signal 98 can be generated from a stored video file, played back from a recording medium such as a magnetic tape, magnetic disk or optical disk, and can include a streaming video signal that is transmitted over a public or private network such as a local area network, wide area network, metropolitan area network or the Internet.

Video signal 110 can include an analog video signal that is formatted in any of a number of video formats including National Television Systems Committee (NTSC), Phase Alternating Line (PAL) or Sequentiel Couleur Avec Memoire (SECAM). Processed video signal includes 112 a digital video codec standard such as H.264, MPEG-4 Part 10 Advanced Video Coding (AVC) or other digital format such as a Motion Picture Experts Group (MPEG) format (such as MPEG1, MPEG2 or MPEG4), Quicktime format, Real Media format, Windows Media Video (WMV) or Audio Video Interleave (AVI), or another digital video format, either standard or proprietary.

Video display devices 104 can include a television, monitor, computer, handheld device or other video display device that creates an optical image stream either directly or indirectly, such as by projection, based on decoding the processed video signal 112 either as a streaming video signal or by playback of a stored digital video file. It is noted that the present invention can also be implemented by transcoding a video stream and storing it or decoding a video stream and storing it, for example, for later playback on a video display device.

Video encoder/decoder 102 includes an entropy decoding module 75 that operates in accordance with the present invention and, in particular, includes many optional functions and features described in conjunction with FIGS. 5-15 that follow.

Figure 5:
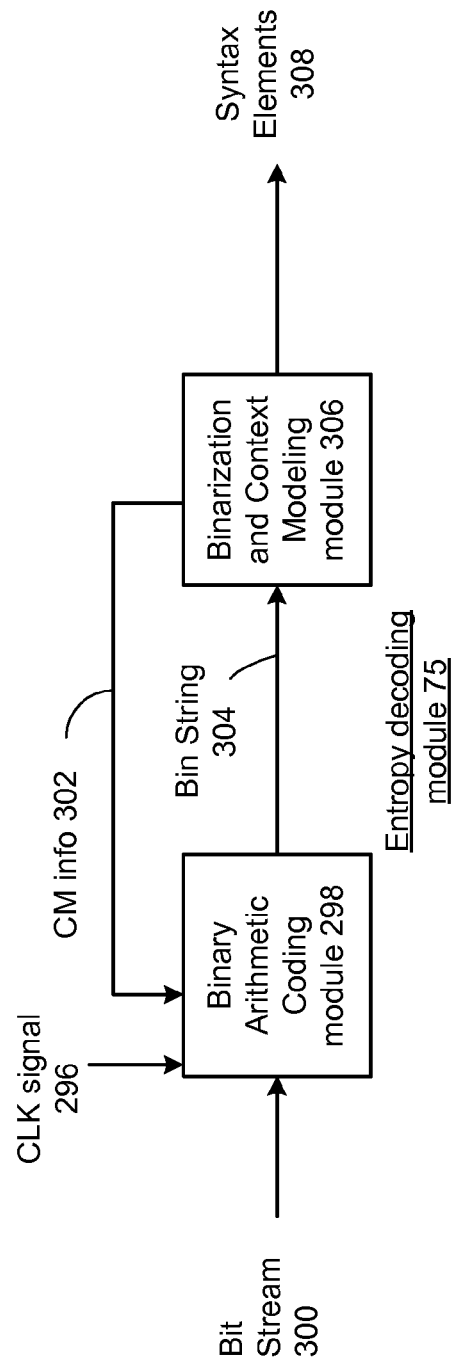
FIG. 5 presents a block diagram representation of an entropy decoding module 75 in accordance with an embodiment of the present invention.

FIG. 5 presents a block diagram representation of an entropy decoding module 75 in accordance with an embodiment of the present invention. In particular, an entropy decoding module 75 is presented for use in a video decoder or video encoder/decoder such as video encoder decoder 102 that decodes a video input signal, such as video signal 110 as a portion of the production of a processed video, such as processed video signal 112. Entropy decoding module includes a binary arithmetic coding (BAC) module 302 that generates a bin string 304 by pipeline processing a bit stream 300, based on a clock signal 296 and based on context model information 302. Binarization and context modeling (BCM) module 306 generates a stream of syntax elements 308 and the context module information 302 that is fed back to BAC module 302.

In an embodiment of the present invention, entropy decoding module 75 generates the bin string 304 from the bit stream 300 in accordance with a context-adaptive binary arithmetic coding (CABAC) as part of a H.264 decoding operation, MPEG decoder or other video decoding operation. The BCM module 306 can be implemented via a decoding state machine or other processing that can be implemented outside the BAC module 302. The BAC module 302 does not need to understand anything about parsing the stream; it can simply read data from the bit stream 300 and converts this bit stream to output "Bins" that a parsing state machine can utilize to make decisions. In an embodiment of the present invention, the BCM module 306 can be viewed as a complex binarization unit that serves the same purpose as a variable length code decoder, such as universal variable length code decoder.

The piped processing performed by BAC module 302 allows entropy decoding module 75 to process one bin per system clock cycle. In other words, bin string 304 can contain a plurality of bin values, and the binary arithmetic coding module 302 can generate one of the plurality of bin values for each of the plurality of cycles of clock signal 296. In particular, the BAC module 302 can use a multistage pipeline architecture with look ahead data forwarding, predictive branching and includes a "backup" function to reset the BAC module 302 backwards one bin if a mistake has been made in branch.

Further details regarding a possible implementation of BAC module 302 and BCM module 306 that includes several optional functions and features are presented in conjunction with FIGS. 6-10 that follow.

Figure 6:
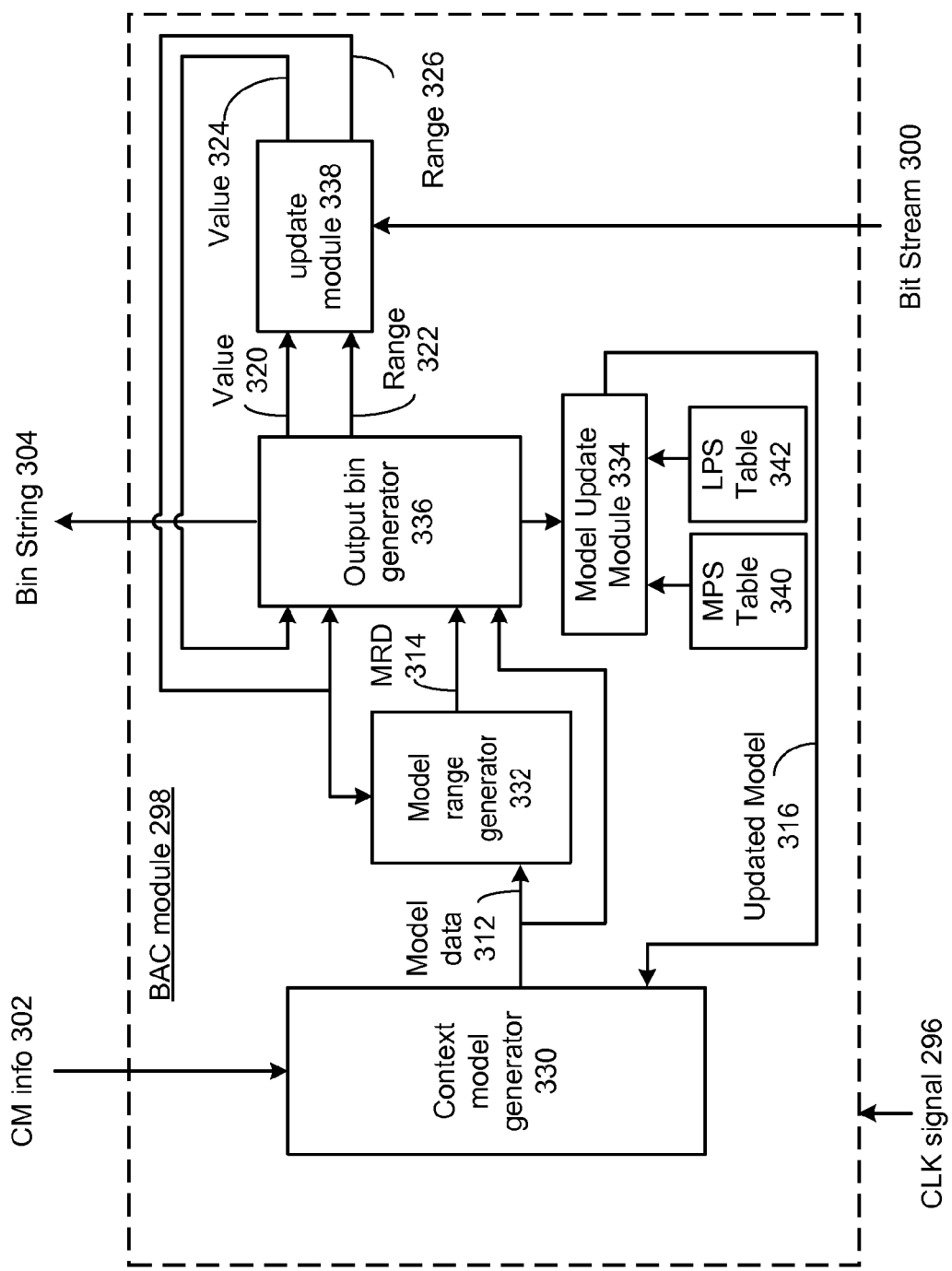
FIG. 6 presents a block diagram representation of a binary arithmetic coding module 298 in accordance with an embodiment of the present invention.

FIG. 6 presents a block diagram representation of a binary arithmetic coding module 298 in accordance with an embodiment of the present invention. BAC module 298 includes a context module generator 330, model range generator 332, output bin generator 336, update module 338, module update module 334, most probable symbol (MPS) table 340 and least probable symbol (LPS) table 342. The BAC module 298 operates based on a context model, such as an adaptive probability model that is based on what part of the bit stream 300 is being decoded (the context), and further based on past decisions (adaptive). "Range" variables such as range 322 and range 326 indicate the probability of the least probable symbol. "Value" variables, such as value 320 and 324 represent the input data from the bit stream. At the start of a slice of the decoded bit stream 300, an initial context model is created based on information from the header.

Context module generator 330 generates model data 312 based on the context model information 302. Model range generator 332 generates model range data 314 based on at least a first portion of the model data 312, and current range data 326. Output bin generator 336 generates the bin string 304 based on the model range data 314, the current range data 326, the current value data 324 and at least a second portion of the model data 312 such as a most probable symbol (MPS).

In an embodiment of the present invention, the context model generator 330 can contain a look up table and the model range generator 332 can contain a state table. For instance, the context model information 302 can contain a context model index that represents the probability density function of the current context and that is used to index the look up table contained in the context module generator 330. The lookup table of context model generator 330 can contain, for each value of the context model index, a state index that can be passed as the first portion of the model data 312 and used to index the state table of the model range generator 332 to generate the model range data 314. In addition, the lookup table or context model generator 330 can contain, for each value of the context model index, a most probable symbol that is passed as the second portion of the model data 312 to the output bin generator 336.

In operation, for each cycle of clock signal 296, the model range generator 332 is utilized to lookup model range data 314, a modeled value of the range, which is then compared to the current value 324 to determine the output for bin string 304. The output value is a sign bit of the current value 324 related to the model range data 314.

Update module 338 generates initial value data 324 and initial range data 326. Thereafter update module 338 iteratively generates current value data 324 and current range data 326 based on the bit stream 300 and based on previous value data 320 and previous range data 322. In particular value data 324 is normalized, more bits are iteratively pulled from the bit stream 300. Model update module 334 generates updated model data 316 for updating model produced by context module generator 330 based on the least probable symbol transition table 342 and most probable symbol transition table 340. The LPS table 342 and MPS table 340 can each be pre-computed.

The context table and range table are updated by accessing transition tables in pre-computed MPS table 340 and LPS table 342. For each cycle of clock 296, the context model information 302 is given to the BAC module 298 by the BCM module 306.

The lookup table of the context model generator 330 can be loaded at the beginning of each slice under the control of a processor such as a state machine or other processing device. The state table of the model range generator 332 can be loaded by dedicated hardware or other device.

Figure 7:
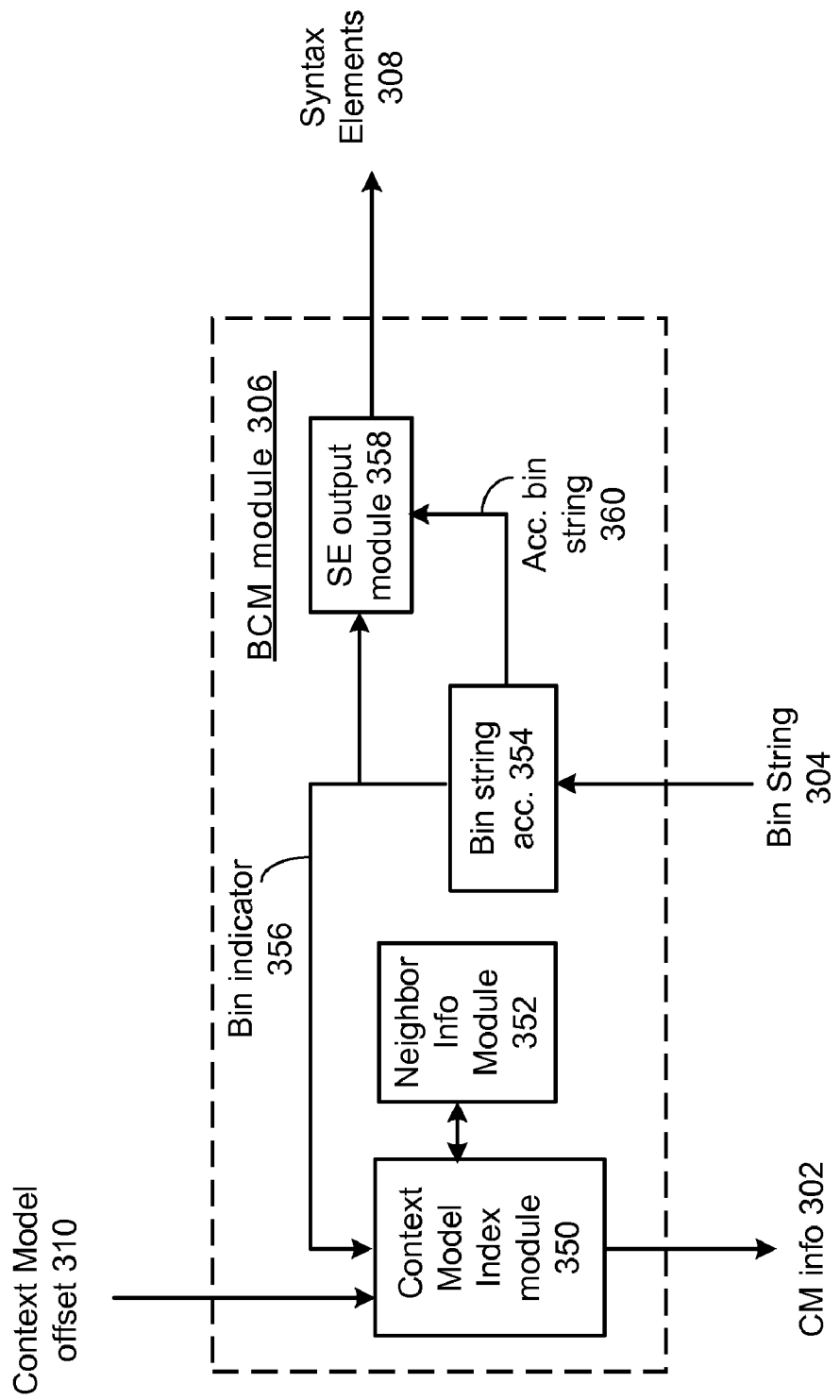
FIG. 7 presents a block diagram representation of a binarization and context modeling module 306 in accordance with an embodiment of the present invention.

FIG. 7 presents a block diagram representation of a binarization and context modeling module 306 in accordance with an embodiment of the present invention. Binarization and context modeling module 306 contains a context module index module 350, a neighbor management module 352, a bin string accumulator 354, and a syntax element output module 358. In particular, current values of bin data of bin string 304 are added by the bin string accumulator 354 to form an accumulated bin string 360. A bin indicator 356 corresponding to the particular bin of current bin data is passed from the bin string accumulator 354 to the context model index module 350. When the bin indicator indicates that the last bin has been reached, syntax element output module 358 generates the syntax elements 308 by parsing the accumulated bin string 360 in accordance with a target format.

Context model offset 310 indicates the particular macroblock of an image that is currently being processed. Neighbor generation module 352 stores neighbor data for macroblocks of the picture that is being decoded. In particular, neighbor generation module 352 generates and/or stores neighbor data for macroblocks of the picture for retrieval by the context model index module 350, and optionally other modules of encoder/decoder 102, when operating on a neighboring macroblock. As the entropy coded data is decoded for a macroblock, neighbor data is stored for use in the processing of neighboring macroblocks that have yet to be processed, yet that will require the use of such data. In addition, neighboring data can also stored for the processing of future pictures, such as future frames and/or fields of video input signal 110.

In an embodiment of the present invention, a data structure, such as a linked list, array or one or more registers are used to associate and store neighbor data for each macroblock. Neighbor data can include motion any data that is used by the entropy coding module 75 or by one or more of the other modules or procedures of the present invention, to calculate results for a current macroblock.

Consider the example where a particular macroblock MB(x,y) requires neighbor data from neighboring macroblocks MB(x−1, y−1), MB(x, y−1), MB (x+1,y−1) and MB(x−1,y). When each macroblock is processed, neighbor data is stored in data structures for each neighboring macroblock that will need this data. For example, when MB(x−1,y−1) is processed, neighbor data is stored, so that each neighboring macroblock that is yet to be processed, including MB(x,y) can use this data. In this fashion, when MB(x,y) is ready to be processed, the neighbor data is already stored in a data structure that corresponds to this macroblock for fast retrieval. In an embodiment of the present invention, neighbor data is stored in a memory buffer, a ring buffer, a cache, or other memory structure or device that can store neighbor data when required for fast retrieval when require for processing neighboring macroblocks but then can be overwritten, deleted or otherwise discarded after all of the neighboring macroblocks that may require each particular instance of neighbor data are through with the neighbor data.

Context module index module 350, via state machine, look-up table or other processing generates the context module information 302, such as a look-up table index, based on the context module offset 310, the bin indicator 356 and based on neighbor data from neighbor information module 352.

Figure 8:
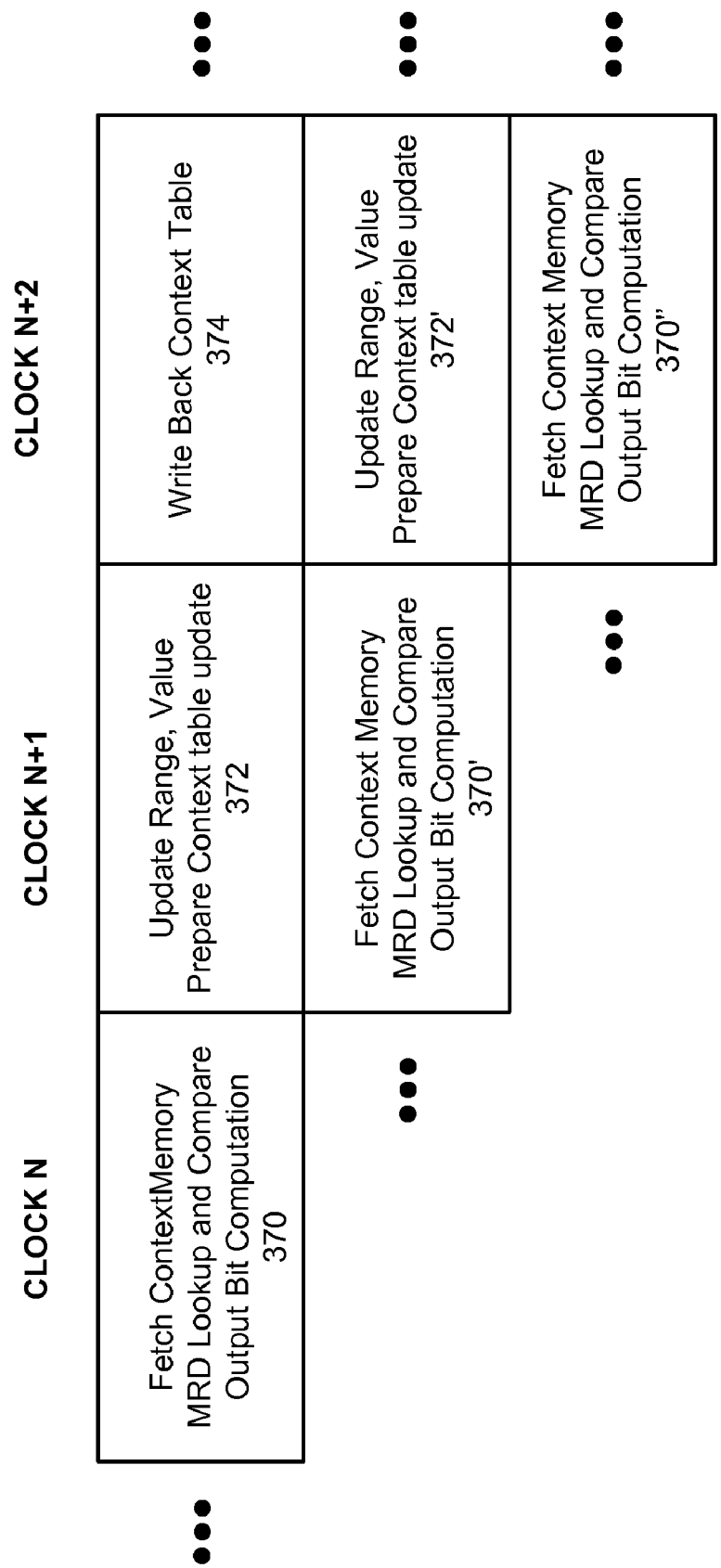
FIG. 8 presents a temporal diagram representation of a process pipeline in accordance with an embodiment of the present invention.

FIG. 8 presents a temporal diagram representation of a process pipeline in accordance with an embodiment of the present invention. In particular, a pipeline processing performed by binary arithmetic coding module 298 is shown that includes processing via a three-stage pipeline. In stage 370 during clock cycle N of clock signal 296, model data 312 is fetched from context memory, the model range data 314 is determined and compared to current value data 324, and an output bit is generated for bin string 304. After this point, the current value data 324 and range data 326 become the previous value data 320 and previous range data 322. In stage 372 during clock cycle N+1, updated range data 326 and value data 324 are computed based on the previous range data 322 and previous value data 320, and new input data is pulled from bit stream 300. Updated model 316 is computed by model update module 334 and is prepared to be written. In stage 374 during clock cycle N+2, the context table of context module generator 330 is written with the updated model 316.

The three stages of the process are pipelined as shown and processed in parallel, so that the net throughput is a one bin of bin string 304 per clock cycle. For instance, during clock cycle N+2, stage 374 of a first process, stage 372' of a second process and stage 370" of a third process are each performed. As shown, the updates for range data 326 and value data 324 are performed after the initial cycle as shown. While the model data 312 is fetched from memory and the MRD 314 is being determined, the range and value are updated based on the previous bit decision by output bin generator 336.

Figure 9:
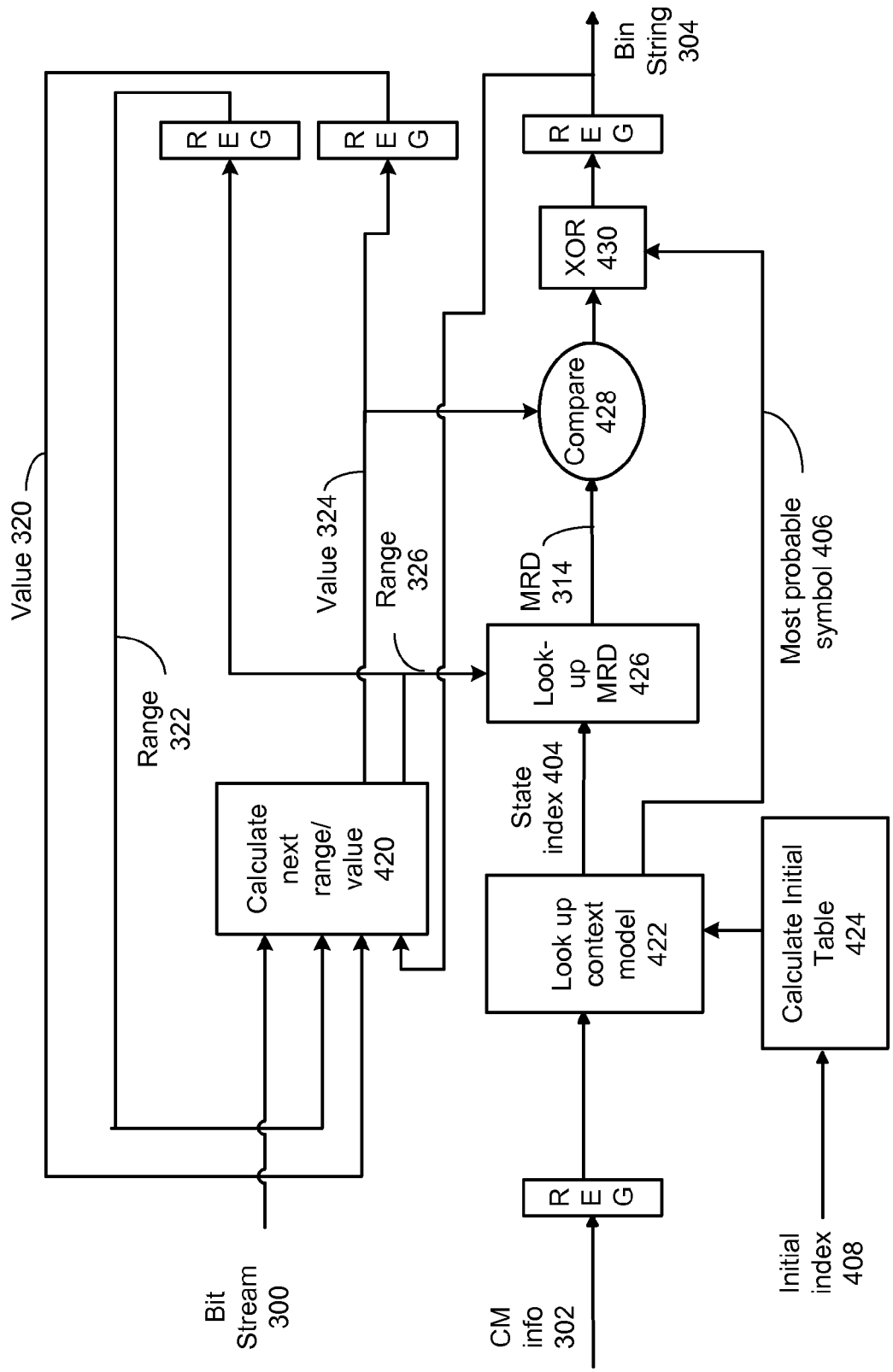
FIG. 9 presents a block flow diagram corresponding to a binary arithmetic coding in accordance with an embodiment of the present invention.

FIG. 9 presents a block flow diagram corresponding to a binary arithmetic coding in accordance with an embodiment of the present invention. The context module information 302 indexes a memory location of a look up table memory to look-up model data 312 that includes the state index 404 and MPS 406 as indicated in block 422. A feed forward multiplexer can be included within this memory to forward write data pending to the same address as the read data. The state index 404 is passed through a hardware lookup table to determine the model range data 314 as indicated by block 426. This module range data 314 is compared in block 428 to the current range 324 and the MPS bit is either inverted or left unchanged via exclusive-or block 430 to create the output bit of bin string 304. This output bit is also fed to the BCM 306 that takes one clock cycle to update the context model info and continue the decoding process. Block 420 computes updates for range data 326 and value data 324 after the initial cycle and then data forwarded to the next CABAC cycle as shown.

While FIGS., 6-9 present possible implementations and operations of BAC module 298 and BCM module in accordance with a pipelined configuration, other implementations are likewise possible.

Figure 10:
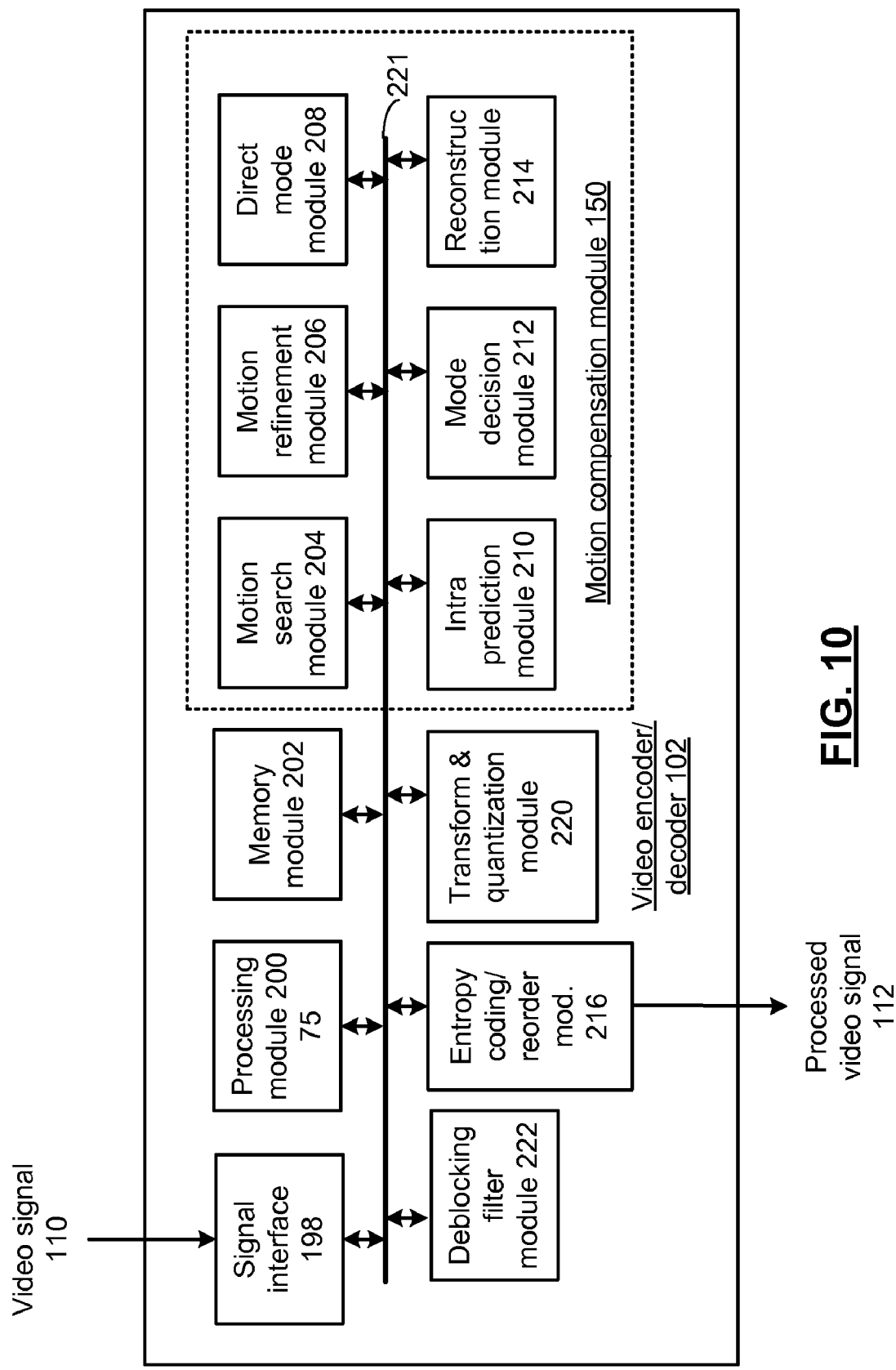
FIG. 10 presents a block diagram representation of a video encoder/decoder 102 in accordance with an embodiment of the present invention.

FIG. 10 presents a block diagram representation of a video encoder/decoder 102 in accordance with an embodiment of the present invention. Video encoder/decoder 102 can be a video codec that operates in accordance with many of the functions and features of the H.264 standard, the MPEG-4 standard, VC-1 (SMPTE standard 421M) or other standard, to process processed video signal 112 to encode, decode or transcode video input signal 110. Video input signal 110 is optionally formatted by signal interface 198 for encoding, decoding or transcoding by video encoder/decoder 102. In particular, video encoder/decoder 102 includes an entropy decoding module, such as entropy decoding module 75 in implementing entropy coding/reorder module 216.

The video encoder/decoder 102 includes a processing module 200 that can be implemented using a single processing device or a plurality of processing devices. Such a processing device may be a microprocessor, co-processors, a micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in a memory, such as memory module 202. Memory module 202 may be a single memory device or a plurality of memory devices. Such a memory device can include a hard disk drive or other disk drive, read-only memory, random access memory, volatile memory, non-volatile memory, static memory, dynamic memory, flash memory, cache memory, and/or any device that stores digital information. Note that when the processing module 200 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

Processing module 200, and memory module 202 are coupled, via bus 221, to the signal interface 198 and a plurality of other modules, such as motion search module 204, motion refinement module 206, direct mode module 208, intra-prediction module 210, mode decision module 212, reconstruction module 214, entropy coding/reorder module 216, forward transform and quantization module 220 and deblocking filter module 222. The modules of video encoder/decoder 102 can be implemented in software, firmware or hardware, depending on the particular implementation of processing module 200. It should also be noted that the software implementations of the present invention can be stored on a tangible storage medium such as a magnetic or optical disk, read-only memory or random access memory and also be produced as an article of manufacture. While a particular bus architecture is shown, alternative architectures using direct connectivity between one or more modules and/or additional busses can likewise be implemented in accordance with the present invention.

Video encoder/decoder 102 can operate in various modes of operation that include an encoding mode and a decoding mode that is set by the value of a mode selection signal that may be a user defined parameter, user input, register value, memory value or other signal. In addition, in video encoder/decoder 102, the particular standard used by the encoding or decoding mode to encode or decode the input signal can be determined by a standard selection signal that also may be a user defined parameter, user input, register value, memory value or other signal. In an embodiment of the present invention, the operation of the encoding mode utilizes a plurality of modules that each perform a specific encoding function. The operation of decoding can also utilizes at least one of these plurality of modules to perform a similar function in decoding. In this fashion, modules such as the motion refinement module 206, direct mode module 208, and intra-prediction module 210, mode decision module 212, reconstruction module 214, transformation and quantization module 220, and deblocking filter module 222, can be used in both the encoding and decoding process to save on architectural real estate when video encoder/decoder 102 is implemented on an integrated circuit or to achieve other efficiencies.

While not expressly shown, video encoder/decoder 102 can include a comb filter or other video filter, and/or other module to support the encoding of video input signal 110 into processed video signal 112.

Further details of specific encoding and decoding processes that use these function specific modules will be described in greater detail in conjunction with FIGS. 11 and 12.

Figure 11:
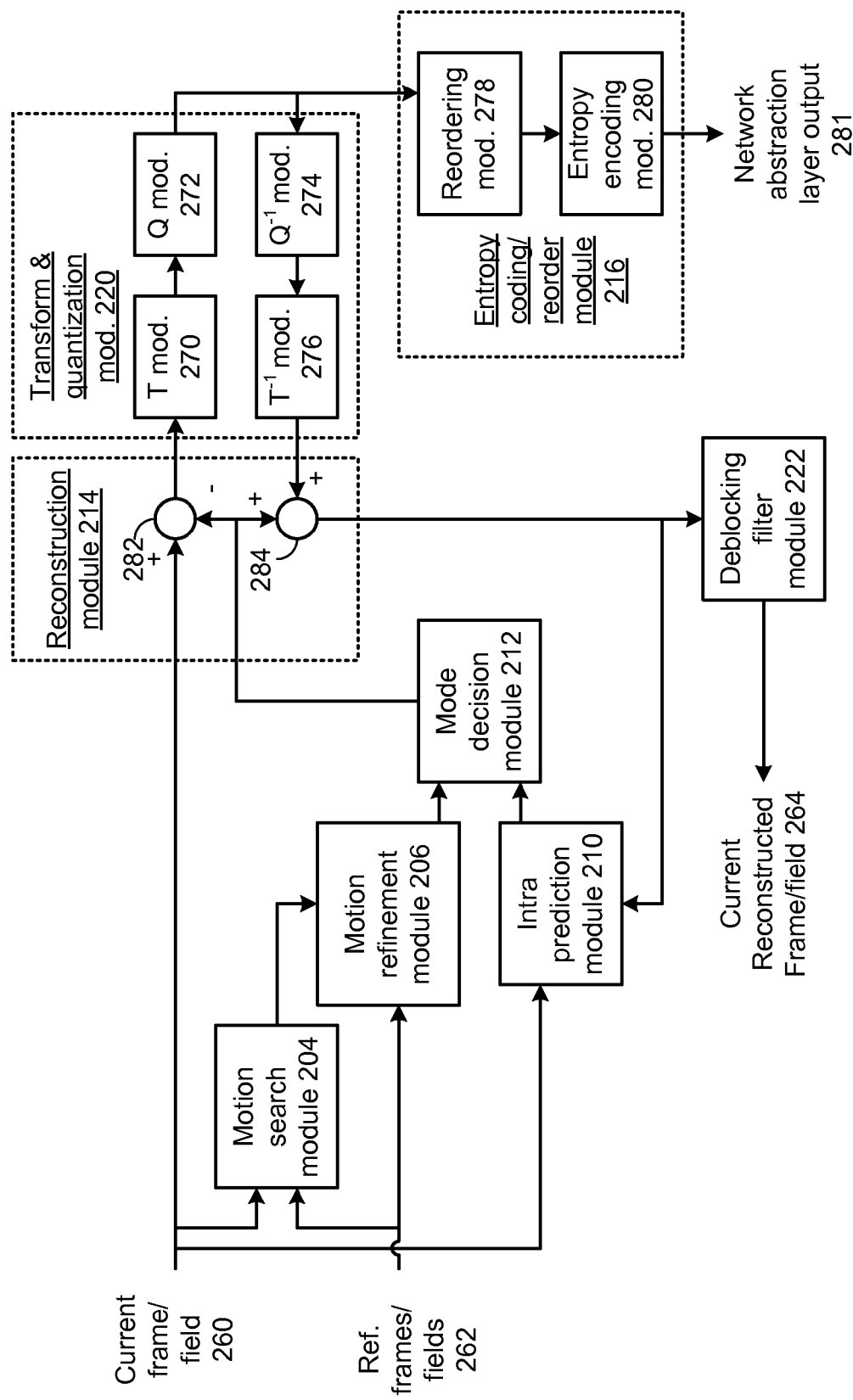
FIG. 11 presents a block flow diagram of a video encoding operation in accordance with an embodiment of the present invention.

FIG. 11 presents a block flow diagram of a video encoding operation in accordance with an embodiment of the present invention. In particular, an example video encoding operation is shown that uses many of the function specific modules described in conjunction with FIG. 10 to implement a similar encoding operation. Motion search module 204 generates a motion search motion vector for each macroblock of a plurality of macroblocks based on a current frame/field 260 and one or more reference frames/fields 262. Motion refinement module 206 generates a refined motion vector for each macroblock of the plurality of macroblocks, based on the motion search motion vector. Intra-prediction module 210 evaluates and chooses a best intra prediction mode for each macroblock of the plurality of macroblocks. Mode decision module 212 determines a final motion vector for each macroblock of the plurality of macroblocks based on costs associated with the refined motion vector, and the best intra prediction mode.

Reconstruction module 214 generates residual pixel values corresponding to the final motion vector for each macroblock of the plurality of macroblocks by subtraction from the pixel values of the current frame/field 260 by difference circuit 282 and generates unfiltered reconstructed frames/fields by re-adding residual pixel values (processed through transform and quantization module 220) using adding circuit 284. The transform and quantization module 220 transforms and quantizes the residual pixel values in transform module 270 and quantization module 272 and re-forms residual pixel values by inverse transforming and dequantization in inverse transform module 276 and dequantization module 274. In addition, the quantized and transformed residual pixel values are reordered by reordering module 278 and entropy encoded by entropy encoding module 280 of entropy coding/reordering module 216 to form network abstraction layer output 281.

Deblocking filter module 222 forms the current reconstructed frames/fields 264 from the unfiltered reconstructed frames/fields. While a deblocking filter is shown, other filter modules such as comb filters or other filter configurations can likewise be used within the broad scope of the present invention. It should also be noted that current reconstructed frames/fields 264 can be buffered to generate reference frames/fields 262 for future current frames/fields 260.

As discussed in conjunction with FIG. 10, one of more of the modules described herein can also be used in the decoding process as will be described further in conjunction with FIG. 12.

Figure 12:
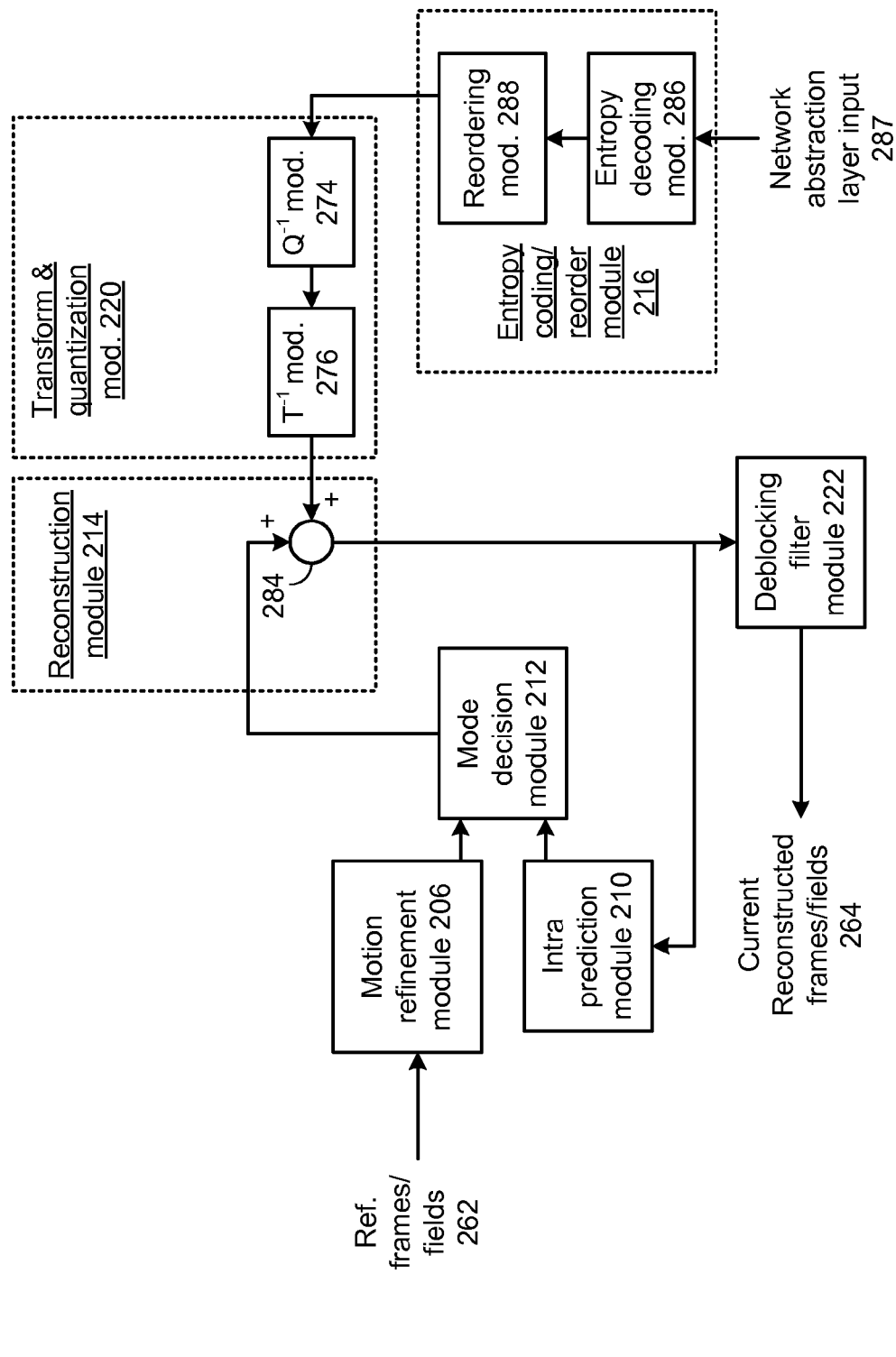
FIG. 12 presents a block flow diagram of a video decoding operation in accordance with an embodiment of the present invention.

FIG. 12 presents a block flow diagram of a video decoding operation in accordance with an embodiment of the present invention. In particular, this video decoding operation contains many common elements described in conjunction with FIG. 11 that are referred to by common reference numerals. In this case, the motion refinement module 206, the intra-prediction module 210, the mode decision module 212, and the deblocking filter module 222 are each used as described in conjunction with FIG. 11 to process reference frames/fields 262. In addition, the reconstruction module 214 reuses the adding circuit 284 and the transform and quantization module reuses the inverse transform module 276 and the inverse quantization module 274. In should be noted that while entropy coding/reorder module 216 is reused, instead of reordering module 278 and entropy encoding module 280 producing the network abstraction layer output 281, network abstraction layer input 287 is processed by entropy decoding module 286, such as entropy decoding module 75, and reordering module 288.

While the reuse of modules, such as particular function specific hardware engines, has been described in conjunction with the specific encoding and decoding operations of FIGS. 11 and 12, the present invention can likewise be similarly employed to the other embodiments of the present invention and/or with other function specific modules used in conjunction with video encoding and decoding.

Figure 13:
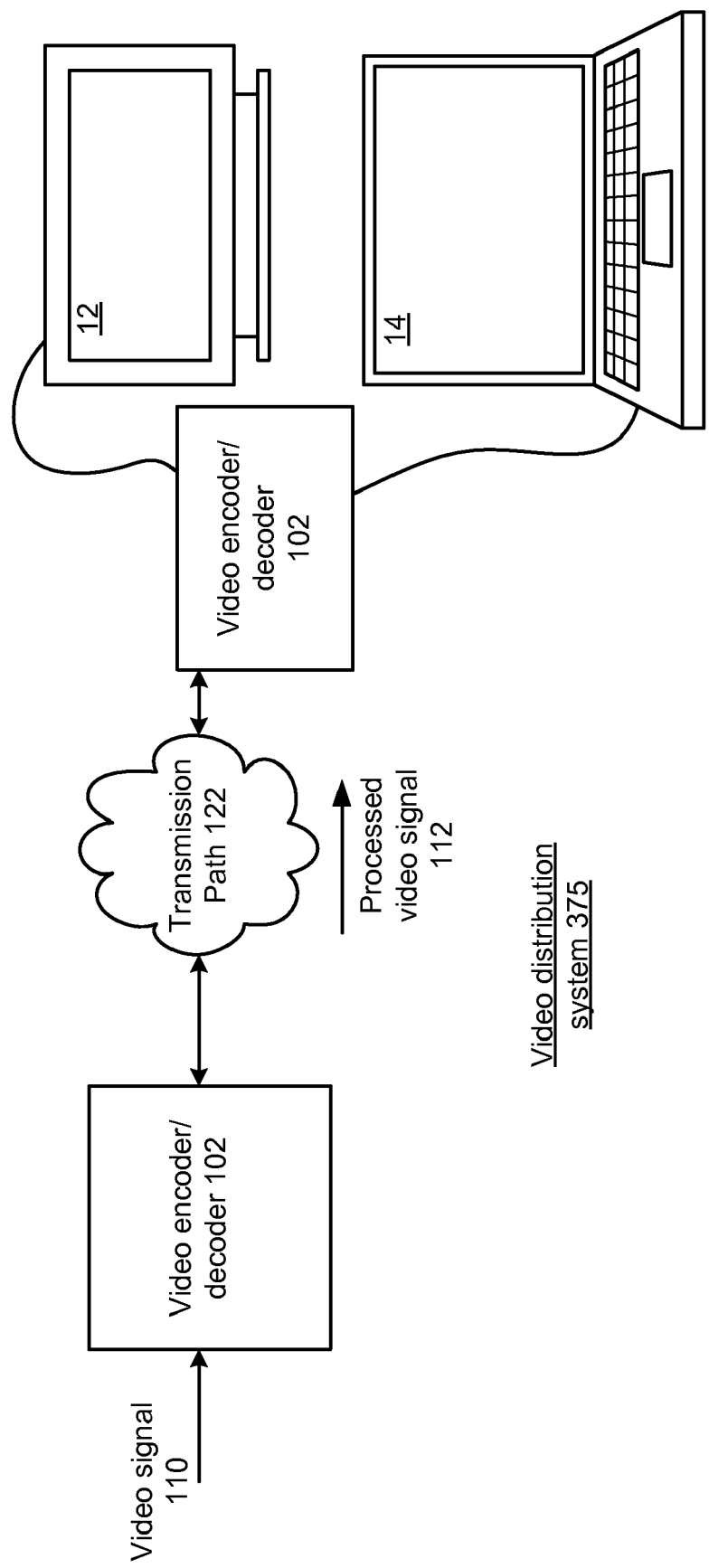
FIG. 13 presents a block diagram representation of a video distribution system 375 in accordance with an embodiment of the present invention.

FIG. 13 presents a block diagram representation of a video distribution system 375 in accordance with an embodiment of the present invention. In particular, processed video signal 112 is transmitted from a first video encoder/decoder 102 via a transmission path 122 to a second video encoder/decoder 102 that operates as a decoder. The second video encoder/decoder 102 operates to decode the processed video signal 112 for display on a display device such as television 10, computer 20 or other display device.

The transmission path 122 can include a wireless path that operates in accordance with a wireless local area network protocol such as an 802.11 protocol, a WIMAX protocol, a Bluetooth protocol, etc. Further, the transmission path can include a wired path that operates in accordance with a wired protocol such as a Universal Serial Bus protocol, an Ethernet protocol or other high speed protocol.

Figure 14:
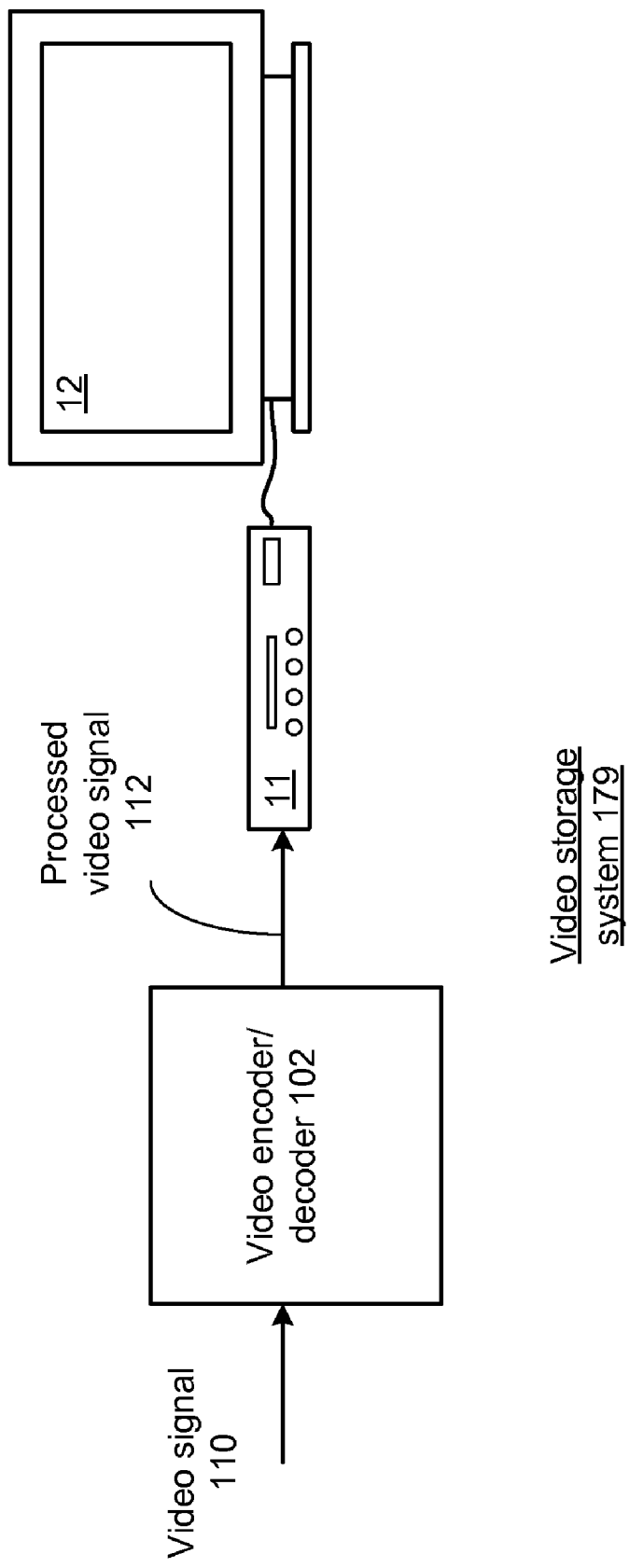
FIG. 14 presents a block diagram representation of a video storage system 179 in accordance with an embodiment of the present invention.

FIG. 14 presents a block diagram representation of a video storage system 179 in accordance with an embodiment of the present invention. In particular, device 11 is a set top box with built-in digital video recorder functionality, a stand alone digital video recorder, a DVD recorder/player or other device that stores the processed video signal 112 for display on video display device such as television 12. While video encoder/decoder 102 is shown as a separate device, it can further be incorporated into device 11. In this configuration, video encoder/decoder 102 can further operate to decode the processed video signal 112 when retrieved from storage to generate a video signal in a format that is suitable for display by video display device 12. While these particular devices are illustrated, video storage system 179 can include a hard drive, flash memory device, computer, DVD burner, or any other device that is capable of generating, storing, decoding and/or displaying the video content of processed video signal 112 in accordance with the methods and systems described in conjunction with the features and functions of the present invention as described herein.

Figure 15:
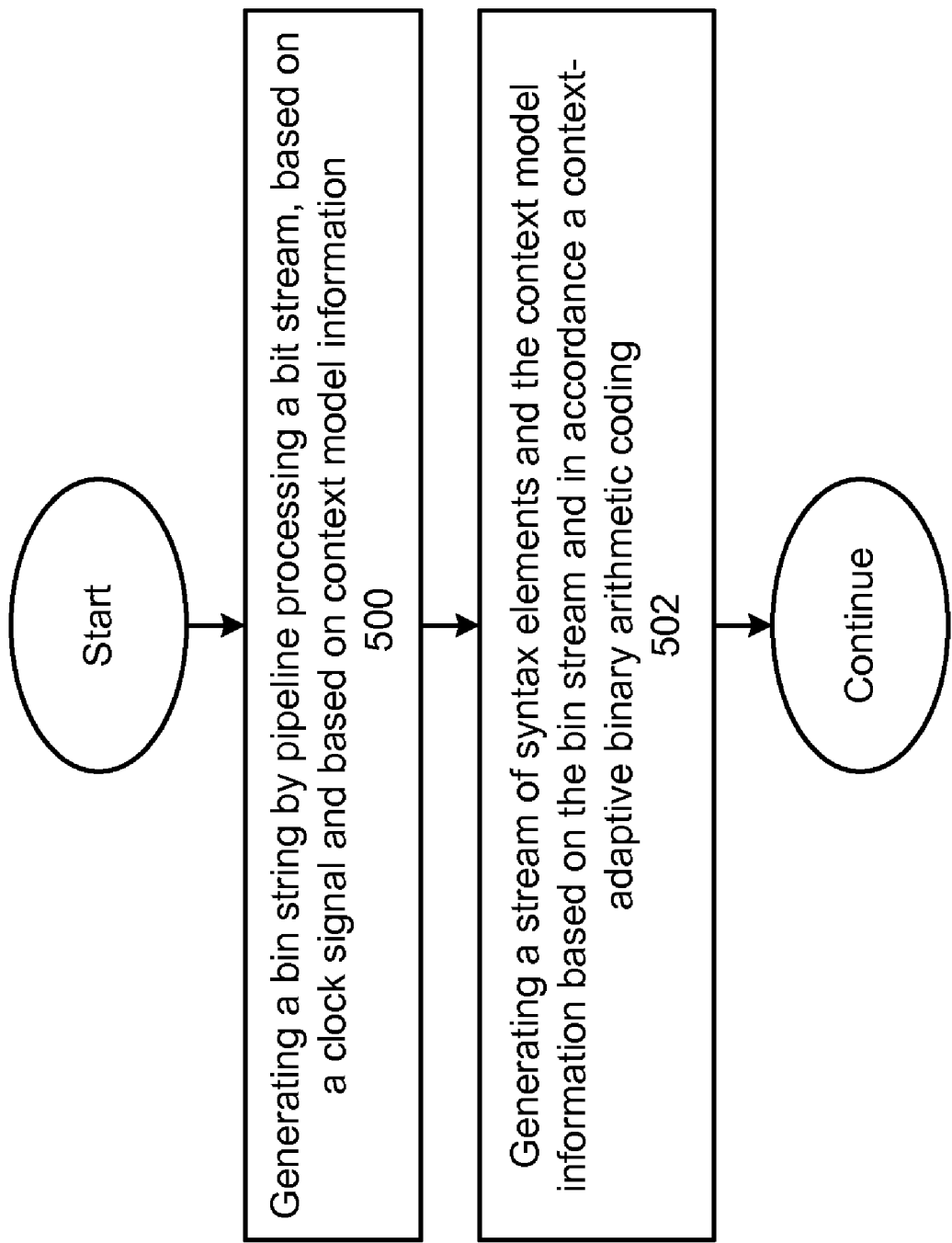
FIG. 15 presents a flowchart representation of a method in accordance with an embodiment of the present invention.

FIG. 15 presents a flowchart representation of a method in accordance with an embodiment of the present invention. In particular, a method is presented for use in conjunction with one or more of the features and functions described in association with FIGS. 1-14. In step 500, a bin string is generated by pipeline processing of a bit stream, based on a clock signal and based on context model information in accordance with a context-adaptive binary arithmetic coding. In step 502, a stream of syntax elements and the context model information is generated, based on the bin string.

In an embodiment of the present invention, the bin string contains a plurality of bin values, the clock signal includes a plurality of cycles and step 500 includes generating one of the plurality of bin values for each of the plurality of cycles of the clock signal. The pipeline processing can include processing via a three-stage pipeline. Step 500 can include: generating initial value data and initial range data; iteratively generating current value data and current range data based on the bit stream and based on previous value data and previous range data; generating model data based on a context model index; generating model range data based on at least a first portion of the model data and current range data; generating the bin string based on the model range data, the current range data, the current value data and at least a second portion of the model data; and generating an updated model data based on a least probable symbol transition table and a most probable symbol transition table. The model data can be generated based on the updated model data.

The model range data can be indicative of a probability of a least probable symbol. The value data can be indicative of current data from the bit stream. The at least one first portion of model data can include a state index and the at least one second portion of model data can include a most probable symbol. The stream of syntax elements can be generated in accordance with at least one of, an H.264 format and a Motion Picture Experts Group (MPEG) format.

In preferred embodiments, the various circuit components are implemented using 0.35 micron or smaller CMOS technology. Provided however that other circuit technologies, both integrated or non-integrated, may be used within the broad scope of the present invention.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As the term module is used in the description of the various embodiments of the present invention, a module includes a functional block that is implemented in hardware, software, and/or firmware that performs one or module functions such as the processing of an input signal to produce an output signal. As used herein, a module may contain submodules that themselves are modules.

Thus, there has been described herein an apparatus and method, as well as several embodiments including a preferred embodiment, for implementing a video processing device, video decoder and an entropy decoder for use therewith. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An entropy decoding module for use in a video decoder that decodes a video input signal, the entropy decoding module comprising:

a binary arithmetic coding module that generates a bin string by pipeline processing a bit stream, based on a clock signal and based on context model information; and binarization and context modeling module, coupled to the binary arithmetic coding module, that generates a stream of syntax elements and the context module information.

2. The entropy decoding module of claim 1 wherein the entropy decoding module generates the bin string from the bit stream in accordance with a context-adaptive binary arithmetic coding.

3. The entropy decoding module of claim 1 wherein the bin string contains a plurality of bin values, the clock signal includes a plurality of cycles and wherein the binary arithmetic coding module generates one of the plurality of bin values for each of the plurality of cycles of the clock signal.

4. The entropy decoding module of claim 1 wherein the pipeline processing includes processing via a three-stage pipeline.

5. The entropy decoding module of claim 1 wherein the binary arithmetic coding module includes;
   an update module, that generates initial value data and initial range data and that iteratively generates current value data and current range data based on the bit stream and based on previous value data and previous range data;
   a context module generator that generates model data based on a context model index;
   a model range generator, coupled to the context module generator, that generates model range data based on at least a first portion of the model data and current range data; and
   an output bin generator, coupled to the range generator, the context module generator and the update module, that generates the bin string based on the model range data, the current range data, the current value data and at least a second portion of the model data.

6. The entropy decoding module of claim 5 wherein the model range data is indicative of a probability of a least probable symbol.

7. The entropy decoding module of claim 5 wherein the value data is indicative of current data from the bit stream.

8. The entropy decoding module of claim 5 further comprising:
   a model update module, coupled to the output bin generator and the context module generator, that generates an updated model data based on a least probable symbol transition table and a most probable symbol transition table;
   wherein the context module generator is updated based on the updated model data.

9. The entropy decoding module of claim 5 wherein the at least one first portion of model data includes a state index and the at least one second portion of model data includes a most probable symbol.

10. The entropy decoding module of claim 1 wherein the video encoder operates in accordance with at least one of, an H.264 format and a Motion Picture Experts Group (MPEG) format.

11. The entropy decoding module of claim 1 wherein the pipeline processing includes look-ahead data forwarding.

12. The entropy decoding module of claim 1 wherein the pipeline processing includes predictive branching.

13. The entropy decoding module of claim 12 herein the pipeline processing includes a back-up function to back-up at least one bin when a branch error is detected.

14. A method for use in a video encoder that encodes a video input signal, the entropy decoding module comprising:
   generating a bin string by pipeline processing a bit stream, based on a clock signal and based on context model information in accordance with a context-adaptive binary arithmetic coding; and
   generating a stream of syntax elements and the context model information, based on the bin string.

15. The method of claim 14 wherein the bin string contains a plurality of bin values, the clock signal includes a plurality of cycles and wherein generating the bin string includes generating one of the plurality of bin values for each of the plurality of cycles of the clock signal.

16. The method of claim 14 wherein the pipeline processing includes processing via a three-stage pipeline.

17. The method of claim 14 wherein generating the bin string includes;
   generating initial value data and initial range data;
   iteratively generating current value data and current range data based on the bit stream and based on previous value data and previous range data;
   generating model data based on a context model index;
   generating model range data based on at least a first portion of the model data and current range data; and
   generating the bin string based on the model range data, the current range data, the current value data and at least a second portion of the model data.

18. The method of claim 17 wherein the model range data is indicative of a probability of a least probable symbol.

19. The method of claim 17 wherein the value data is indicative of current data from the bit stream.

20. The method of claim 17 further comprising:
   generating an updated model data based on a least probable symbol transition table and a most probable symbol transition table;
   wherein the model data is generated based on the updated model data.

21. The method of claim 17 wherein the at least one first portion of model data includes a state index and the at least one second portion of model data includes a most probable symbol.

22. The method of claim 14 wherein the stream of syntax elements is generated in accordance with at least one of, an H.264 format and a Motion Picture Experts Group (MPEG) format.

23. A video processing device that generates a processed video signal in response to a received video signal, the video processing device comprising:
   a video decoder that decodes the video input signal, the video decoder having an entropy decoding module including:
      a binary arithmetic coding module that generates a bin string by pipeline processing a bit stream, based on a clock signal and based on context model information; and
      binarization and context modeling module, coupled to the binary arithmetic coding module, that generates a stream of syntax elements and the context model information, based on the bin string.

24. The video processing device of claim 23 wherein the entropy decoding module generates the bin string in accordance with a context-adaptive binary arithmetic coding.

25. The video processing device of claim 23 wherein the pipeline processing includes look-ahead data forwarding.

26. The video processing device of claim 23 wherein the pipeline processing includes predictive branching.

27. The video processing device of claim 26 herein the pipeline processing includes a back-up function to back-up at least one bin when a branch error is detected.

* * * * *